(12) United States Patent
Ke et al.

(10) Patent No.: US 12,113,004 B2
(45) Date of Patent: Oct. 8, 2024

(54) ELECTRONIC PACKAGE AND MANUFACTURING METHOD THEREOF

(71) Applicant: SILICONWARE PRECISION INDUSTRIES CO., LTD., Taichung (TW)

(72) Inventors: Chung-Yu Ke, Taichung (TW); Po-Kai Huang, Taichung (TW); Liang-Pin Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 415 days.

(21) Appl. No.: 17/674,457

(22) Filed: Feb. 17, 2022

(65) Prior Publication Data

US 2023/0197591 A1    Jun. 22, 2023

(30) Foreign Application Priority Data

Dec. 21, 2021  (TW) ................................. 110147934

(51) Int. Cl.
| | |
|---|---|
| *H01L 23/498* | (2006.01) |
| *H01L 21/48* | (2006.01) |
| *H01L 23/00* | (2006.01) |
| *H01L 25/10* | (2006.01) |

(52) U.S. Cl.
CPC .... *H01L 23/49822* (2013.01); *H01L 21/4857* (2013.01); *H01L 23/49816* (2013.01); *H01L 24/32* (2013.01); *H01L 25/105* (2013.01); *H01L 2224/32145* (2013.01); *H01L 2225/1041* (2013.01); *H01L 2225/1058* (2013.01); *H01L 2225/107* (2013.01)

(58) Field of Classification Search
CPC ........... H01L 23/49822; H01L 21/4857; H01L 23/49816; H01L 25/105
See application file for complete search history.

(56) References Cited

U.S. PATENT DOCUMENTS

| | | | |
|---|---|---|---|
| 2018/0286824 A1* | 10/2018 | Jeng | .................... H01L 21/6835 |
| 2022/0246590 A1* | 8/2022 | Yu | ........................ H01L 21/6835 |

* cited by examiner

*Primary Examiner* — Marc Anthony Armand
(74) *Attorney, Agent, or Firm* — Dority & Manning, P.A.

(57) ABSTRACT

An electronic package is provided and includes stacking a first packaging module having a circuit structure, an electronic element, a plurality of first conductive elements and a first packaging layer with a second packaging module having a routing structure, a plurality of second conductive elements and a second packaging layer, so that the second packaging layer is formed on the first packaging layer in a manner that the routing structure is overlapped on the circuit structure, where each of the second conductive elements is correspondingly bonded with each of the first conductive elements. Accordingly, the circuit structure and the routing structure are manufactured separately at the same time, so as to shorten the process time and control the stress distribution on the circuit structure and the routing structure separately.

10 Claims, 4 Drawing Sheets

ELECTRONIC PACKAGE AND MANUFACTURING METHOD THEREOF

BACKGROUND

1. Technical Field

The present disclosure relates to a semiconductor device, and more particularly, to an electronic package capable of reducing stress and a manufacturing method thereof.

2. Description of Related Art

In order to ensure the continued miniaturization and versatility of electronic products and communication equipment, semiconductor packages need to be miniaturized to facilitate multi-pin connections and have high functionality. For example, in advanced process packaging, common packaging types are such as 2.5D packaging process, a process for fan-out wiring in combination with package on package elements (FO-POP for short) and the like. Among them, FO-POP has the advantages of low cost and many material suppliers compared with the 2.5D packaging process.

FIGS. 1A and 1B are schematic cross-sectional views illustrating a manufacturing method of a conventional FO-POP semiconductor package 1.

As shown in FIG. 1A, at least one semiconductor chip 11 and a plurality of conductive pillars 13 are disposed on a circuit structure 10 having a fan-out redistribution layer (RDL) 100.

As shown in FIG. 1B, an encapsulating layer 15 is formed on the circuit structure 10 in a manner that the encapsulating layer 15 covers the semiconductor chip 11 and the conductive pillars 13, so that the semiconductor chip 11 is buried in the encapsulating layer 15. Then, a routing structure 12 is formed on the encapsulating layer 15 by a fan-out RDL process, and a redistribution layer 120 of the routing structure 12 is electrically connected to the conductive pillars 13, so that the semiconductor chip 11 is electrically connected to the redistribution layer 120 of the routing structure 12 via the redistribution layer 100 of the circuit structure 10 and the conductive pillars 13.

However, in the aforementioned semiconductor package 1, since the fan-out process takes a long time, fabricating the circuit structure 10 and the routing structure 12 successively will lengthen the fabrication time and increase the fabrication cost.

In addition, if the semiconductor package 1 needs to be arranged with multiple redistribution layers 100, 120, fabricating the routing structure 12 on the circuit structure 10 is prone to uneven stress distribution, resulting in some of the redistribution layers 100, 120 were broken due to the inability to withstand the stress concentration.

Therefore, how to overcome the above-mentioned shortcomings of the prior art has become an urgent problem to be solved at present.

SUMMARY

In view of the various deficiencies of the prior art, the present disclosure provides an electronic package, comprising: a circuit structure; at least an electronic element disposed on the circuit structure and electrically connected to the circuit structure; a plurality of first conductive elements disposed on the circuit structure and electrically connected to the circuit structure; a first packaging layer formed on the circuit structure to cover the electronic element and the plurality of conductive elements; and a packaging module bonded onto the first packaging layer, wherein the packaging module includes a routing structure, a plurality of second conductive elements disposed on the routing structure and electrically connected to the routing structure, and a second packaging layer formed on the routing structure to cover the plurality of second conductive elements, wherein the packaging module is disposed on the first packaging layer with the second packaging layer thereof, such that the routing structure is overlapped on the circuit structure, and wherein each of the second conductive elements is correspondingly bonded with each of the first conductive elements, such that the plurality of second conductive elements are electrically connected to the plurality of first conductive elements.

The present disclosure also provides a manufacturing method of an electronic package, comprising: disposing an electronic element and a plurality of first conductive elements on a circuit structure, wherein the circuit structure is electrically connected to the electronic element and the plurality of first conductive elements; forming a first packaging layer on the circuit structure, wherein the first packaging layer covers the electronic element and the plurality of first conductive elements to form a first packaging module; and disposing a second packaging module on the first packaging layer of the first packaging module, wherein the second packaging module comprises a routing structure, a plurality of second conductive elements disposed on the routing structure and a second packaging layer formed on the routing structure to cover the plurality of second conductive elements, and wherein the second packaging module is disposed on the first packaging layer of the first packaging module via the second packaging layer, the routing structure is overlapped on the circuit structure, each of the second conductive elements is correspondingly bonded with each of the first conductive elements, such that the plurality of second conductive elements are electrically connected to the plurality of first conductive elements.

In the aforementioned electronic package and manufacturing method thereof, the first packaging layer has a coefficient of thermal expansion different from a coefficient of thermal expansion of the second packaging layer.

In the aforementioned electronic package and manufacturing method thereof, the present disclosure further comprises forming a bonding layer on the first packaging layer, wherein the second packaging layer is disposed on the first packaging layer via the bonding layer. For example, the bonding layer covers joints between the plurality of first conductive elements and the plurality of second conductive elements.

In the aforementioned electronic package and manufacturing method thereof, end portions of the plurality of first conductive elements and end portions of the plurality of second conductive elements are exposed from the first packaging layer and the second packaging layer, respectively.

It can be seen from the above that, in the electronic package and the manufacturing method thereof according to the present disclosure, the circuit structure and the routing structure are manufactured separately at the same time, so as to shorten the process time. Therefore, compared with the prior art, the manufacturing method according to the present disclosure can effectively reduce the manufacturing cost.

Furthermore, since the circuit structure is made separately from the routing structure, the routing structure is free from being made on the circuit structure. Therefore, compared with the prior art, if the electronic package needs to be arranged with multiple redistribution layers, the stress distribution on the circuit structure and the routing structure can be controlled separately, thereby effectively reducing the stress and avoiding the problem of the circuit layer and the routing layer being broken due to the inability to withstand the stress concentration.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "first," "second" and the like used herein are used for clear explanation rather than limiting the practicable scope of the present disclosure, and thus, alterations or adjustments of the relative relationships thereof without essentially altering the technical contents should still be considered in the practicable scope of the present disclosure.

FIGS. 2A to 2E are schematic cross-sectional views illustrating a manufacturing method of an electronic package 2 according to the present disclosure.

Figure 1A:
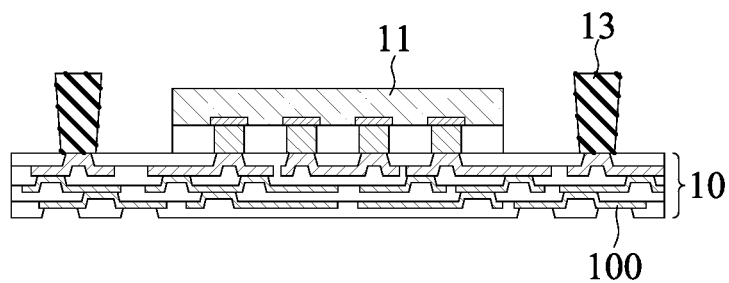
FIGS. 1A and 1B are schematic cross-sectional views illustrating a manufacturing method of a conventional semiconductor package.
Figure 1B:
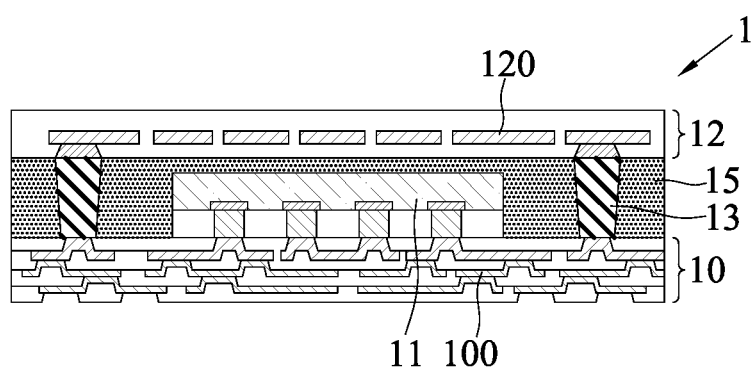
Figure 2A:
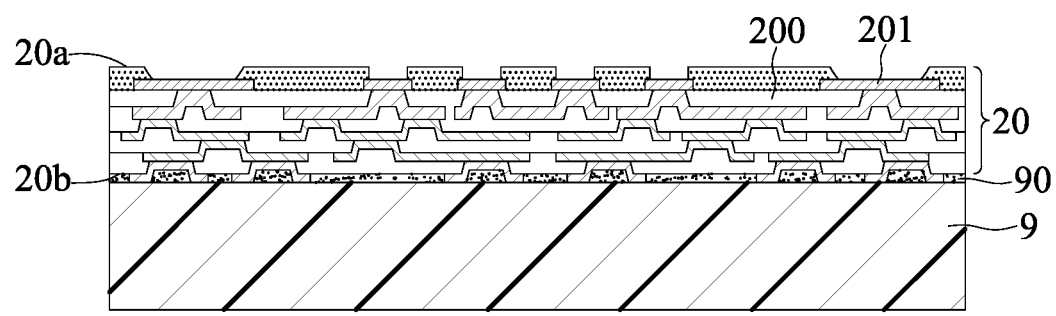
FIGS. 2A to 2E are schematic cross-sectional views illustrating a manufacturing method of an electronic package according to the present disclosure.

As shown in FIG. 2A, a circuit structure 20 is formed on a carrier 9. The circuit structure 20 has a first side 20a and a second side 20b opposite to the first side 20a, so that the circuit structure 20 is bonded to the carrier 9 with the second side 20b thereof.

In an embodiment, the circuit structure 20 is, for example, a package substrate with a core layer and a circuit layer or a coreless substrate structure. The circuit structure 20 includes at least one dielectric layer 200 and a circuit layer 201 bonded to the dielectric layer 200. For example, a coreless substrate structure is formed by a redistribution layer (RDL) manufacturing method, wherein the material for forming the circuit layer 201 is copper, and the material for forming the dielectric layer 200 is a dielectric material such as polybenzoxazole (PBO), polyimide (PI), prepreg (PP) and the like. It should be understood that the circuit structure 20 can also be other carrier plates for carrying electronic elements such as chips, such as a silicon interposer, and is not limited to the abovementioned ones.

Furthermore, the carrier 9 is, for example, a plate made of semiconductor material (such as silicon or glass), and a release layer 90 is formed thereon, so that the circuit structure 20 is bonded onto the release layer 90.

Figure 2B:
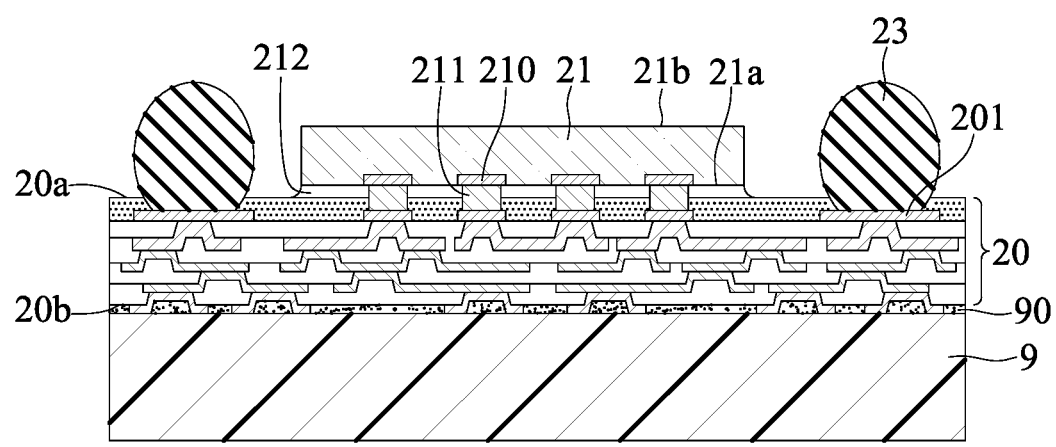

As shown in FIG. 2B, at least one electronic element 21 is disposed on the first side 20a of the circuit structure 20, and a plurality of first conductive elements 23 are formed on the circuit layer 201 of the first side 20a of the circuit structure 20.

In an embodiment, the electronic element 21 is an active element, a passive element, or a combination of the active element and the passive element, wherein the active element is, for example, a semiconductor chip, and the passive element is, for example, a resistor, a capacitor, or an inductor. For example, the electronic element 21 is a semiconductor chip, which has an active surface 21a and an inactive surface 21b opposite to the active surface 21a, and the active surface 21a has a plurality of electrode pads 210, such that the electronic element 21 is electrically connected to the circuit layer 201 with its electrode pads 210 by flip chip (via a plurality of conductive bumps 211 as shown in FIG. 2B), and then the conductive bumps 211 are covered with an underfill 212; alternatively, the electronic element 21 can also be electrically connected to the circuit layer 201 via a plurality of bonding wires (not shown); or, the electronic element 21 can directly contact the circuit layer 201. However, the manner in which the electronic element 21 is electrically connected to the circuit layer 201 is not limited to the above.

Furthermore, the first conductive elements 23 are blocks such as solder balls, and the plurality of first conductive elements 23 are bonded (e.g., welded) onto the circuit layer 201 by a ball placement process, so that the plurality of first conductive elements 23 are electrically connected to the circuit layer 201.

Figure 2C:
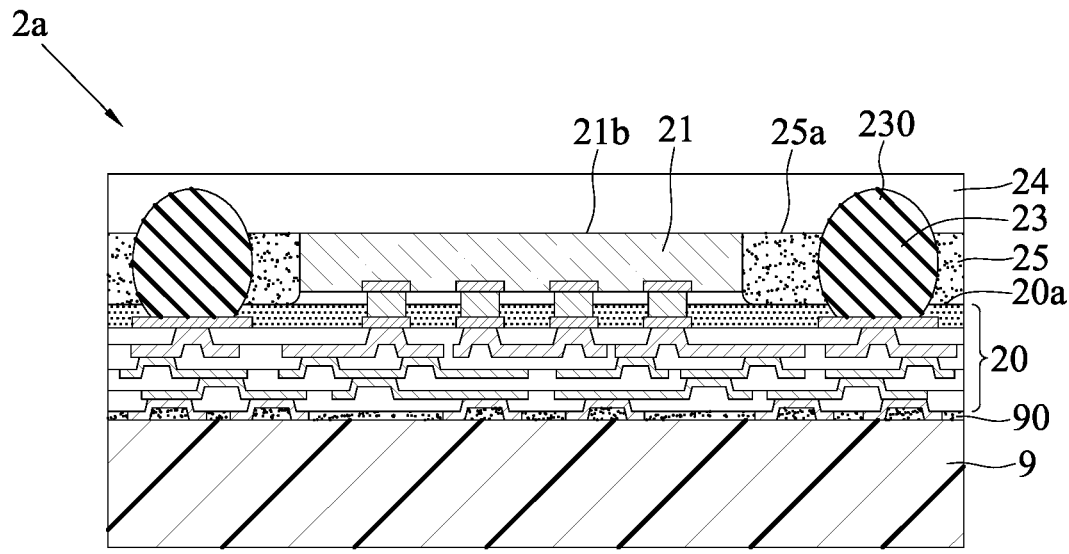

As shown in FIG. 2C, a first packaging layer 25 is formed on the first side 20a of the circuit structure 20 in a manner that the first packaging layer 25 covers the electronic element 21 and the plurality of first conductive elements 23. Then, a bonding layer 24 is formed on the first packaging layer 25 to form a first packaging module 2a on the carrier 9.

In an embodiment, the first packaging layer 25 is an insulating material, such as polyimide (PI), a dry film, or an encapsulant of, for example epoxy resin or a packaging material (molding compound). The first packaging layer 25 can be formed on the first side 20a of the circuit structure 20 by lamination or molding.

Furthermore, a planarization process, such as etching, may be used to remove a portion of the first packaging layer 25, so that a surface 25a on the upper side of the first packaging layer 25 is flush with the inactive surface 21b of the electronic element 21, and the first conductive elements 23 protrude and are exposed from the surface 25a of the first packaging layer 25 to form protrusions 230. As a result, the bonding layer 24 is in contact with and covers the inactive surface 21b of the electronic element 21 and covers the protrusions 230 of the first conductive elements 23.

Furthermore, the bonding layer 24 is an adhesive material, such as an adhesive film, which is different from the material of the first packaging layer 25.

Figure 2D:
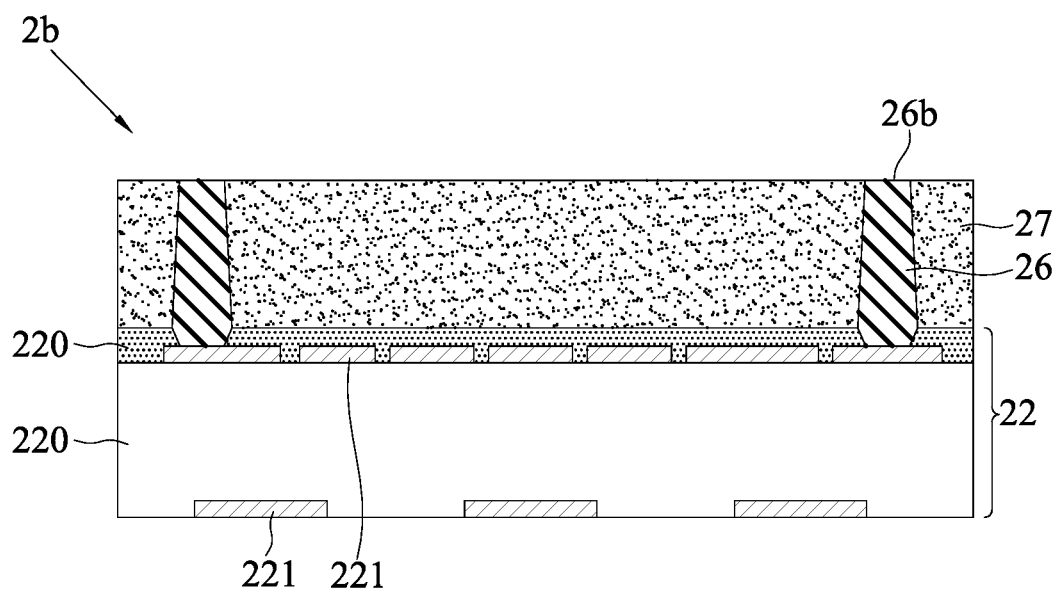

As shown in FIG. 2D, during the processes shown in FIGS. 2A to 2C, other processes are simultaneously performed, that is, a plurality of second conductive elements 26 are formed on a routing structure 22, then a second packaging layer 27 is formed on the routing structure 22 to cover the second conductive elements 26, and end portions 26b of the plurality of second conductive elements 26 are exposed from the second packaging layer 27, thereby forming a second packaging module 2b.

In an embodiment, the routing structure 22 is, for example, a package substrate with a core layer and a circuit layer or a coreless substrate structure. The routing structure 22 includes at least one insulating layer 220 and a routing layer 221 bonded to the insulating layer 220. For example, a coreless substrate structure is formed by a redistribution layer (RDL) manufacturing method, wherein the material for forming the routing layer 221 is copper, and the material for forming the insulating layer 220 is a dielectric material such as polybenzoxazole (PBO), polyimide (PI), prepreg (PP) and the like. It should be understood that the routing structure 22 can also be other carrier plates for carrying electronic elements such as chips, such as a silicon interposer, and is not limited to the abovementioned ones.

Furthermore, the second conductive elements 26 are electrically connected to the routing structure 22, and the second conductive elements 26 are metal pillars such as copper pillars or pillars made of other materials.

Furthermore, the second packaging layer 27 is an insulating material, such as polyimide (PI), a dry film, or an encapsulant of, for example epoxy resin or a packaging material (molding compound). The second packaging layer 27 can be formed on the routing structure 22 by lamination or molding. It should be understood that the material for forming the second packaging layer 27 may be the same or different from the material for forming the first packaging layer 25. For example, a coefficient of thermal expansion (CTE) of the first packaging layer 25 is different from a coefficient of thermal expansion of the second packaging layer 27.

Figure 2E:
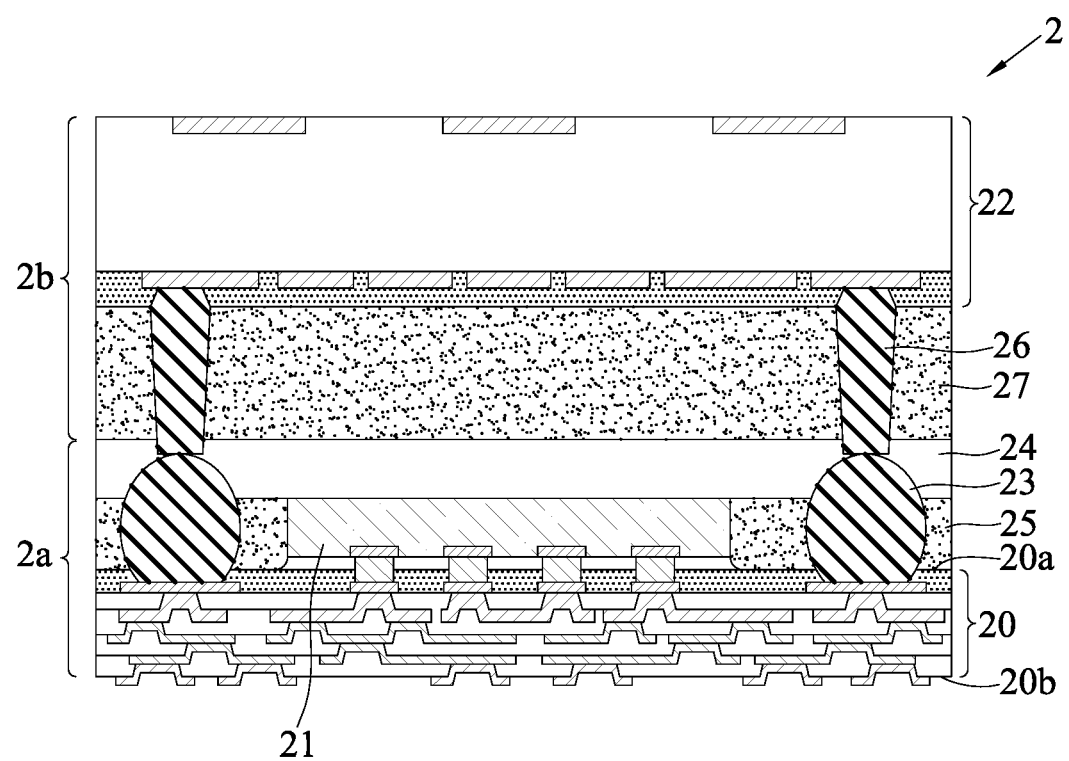

As shown in FIG. 2E, the second packaging module 2b is bonded onto the bonding layer 24 of the first packaging module 2a with its second packaging layer 27, so that the routing structure 22 is overlapped on the circuit structure 20, and each of the second conductive elements 26 is correspondingly bonded with each of the first conductive elements 23, so that the plurality of second conductive elements 26 are electrically connected to the plurality of first conductive elements 23. Thereafter, the carrier 9 and the release layer 90 are removed to expose the second side 20b of the circuit structure 20, and then the electronic package 2 is manufactured.

In an embodiment, the plurality of second conductive elements 26 can be inserted into the bonding layer 24 to contact the plurality of first conductive elements 23, so that the bonding layer 24 covers joints between the plurality of first conductive elements 23 and the plurality of second conductive elements 26.

In addition, in the subsequent manufacturing process, a ball placement process can be performed on the second side 20b of the circuit structure 20 to form a plurality of solder balls (not shown) for connecting and placing a circuit board (not shown).

Therefore, the manufacturing method according to the present disclosure mainly includes separately manufacturing the circuit structure 20 and the routing structure 22 at the same time to shorten the process time. Therefore, compared with the prior art, the manufacturing method according to the present disclosure can effectively reduce the manufacturing cost.

Furthermore, since the circuit structure 20 is made separately from the routing structure 22, the routing structure 22 is free from being made on the circuit structure 20. Therefore, if the electronic package 2 needs to be arranged with multiple redistribution layers, the stress distribution on the circuit structure 20 and the routing structure 22 can be controlled separately, thereby effectively reducing the stress and avoiding the problem of the circuit layer 201 and the routing layer 221 being broken due to the inability to withstand the stress concentration.

On the other hand, the coefficient of thermal expansion of the first packaging layer 25 can be different from the coefficient of thermal expansion of the second packaging layer 27 to disperse the stress. Therefore, when the second packaging layer 27 is bonded onto the bonding layer 24, the stress of the routing structure 22 and the circuit structure 20 can be effectively dispersed, thereby reducing the stress and avoiding the problem of the circuit layer 201 and the routing layer 221 being broken due to the inability to withstand the stress concentration.

The present disclosure also provides an electronic package 2, which comprises: a circuit structure 20, at least one electronic element 21, a plurality of first conductive elements 23, a first packaging layer 25 and a second packaging module 2b.

The electronic element 21 is disposed on the circuit structure 20 and electrically connected to the circuit structure 20.

The plurality of first conductive elements 23 are disposed on the circuit structure 20 and electrically connected to the circuit structure 20.

The first packaging layer 25 is formed on the circuit structure 20 to cover the electronic element 21 and the plurality of first conductive elements 23.

The second packaging module 2b is bonded onto the first packaging layer 25, wherein the second packaging module 2b includes a routing structure 22, a plurality of second conductive elements 26 disposed on the routing structure 22 and electrically connected to the routing structure 22, and a second packaging layer 27 formed on the routing structure 22 to cover the plurality of second conductive elements 26, so that the second packaging module 2b is disposed on the first packaging layer 25 with its second packaging layer 27 in a manner that the routing structure 22 is overlapped on the circuit structure 20, and each of the second conductive elements 26 is correspondingly bonded with each of the first conductive elements 23, such that the second conductive elements 26 are electrically connected to the first conductive elements 23.

In one embodiment, the coefficient of thermal expansion of the first packaging layer 25 is different from the coefficient of thermal expansion of the second packaging layer 27.

In one embodiment, a bonding layer 24 is formed on the first packaging layer 25, so that the second packaging layer 27 is bonded to the bonding layer 24. For example, the bonding layer 24 covers the joints between the first conductive elements 23 and the second conductive elements 26.

In one embodiment, at least one of the first conductive elements 23 and the second conductive elements 26 is a solder ball or a metal pillar.

In summary, in the electronic package and the manufacturing method thereof according to the present disclosure, the circuit structure and the routing structure are manufactured separately at the same time, so as to shorten the process time and control the stress distribution on the circuit structure and the routing structure separately. Therefore, the present disclosure can not only reduce the manufacturing cost, but also avoid the problem of circuit breakage.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
a circuit structure;
an electronic element disposed on and electrically connected to the circuit structure;
a plurality of first conductive elements disposed on and electrically connected to the circuit structure;
a first packaging layer formed on the circuit structure to cover the electronic element and the plurality of conductive elements; and
a packaging module disposed on the first packaging layer, wherein the packaging module includes a routing structure, a plurality of second conductive elements disposed on and electrically connected to the routing structure, and a second packaging layer formed on the routing structure to cover the plurality of second conductive elements, wherein the packaging module is disposed on the first packaging layer via the second packaging layer thereof, such that the routing structure is overlapped on the circuit structure, and wherein each of the second conductive elements is correspondingly and directly bonded with and electrically connected to each of the first conductive elements.

2. The electronic package of claim 1, wherein the first packaging layer has a coefficient of thermal expansion different from a coefficient of thermal expansion of the second packaging layer.

3. The electronic package of claim 1, further comprising a bonding layer formed on the first packaging layer for the second packaging layer to be attached to the first packaging layer via the bonding layer.

4. The electronic package of claim 3, wherein the bonding layer covers joints between the plurality of first conductive elements and the plurality of second conductive elements.

5. The electronic package of claim 1, wherein end portions of the plurality of first conductive elements and end portions of the plurality of second conductive elements are exposed from the first packaging layer and the second packaging layer, respectively.

6. A method of manufacturing an electronic package, comprising:
disposing at least an electronic element and a plurality of first conductive elements on a circuit structure, wherein the circuit structure is electrically connected to the electronic element and the plurality of first conductive elements;
forming a first packaging layer on the circuit structure, wherein the first packaging layer covers the electronic element and the plurality of first conductive elements to form a first packaging module; and
disposing a second packaging module on the first packaging layer of the first packaging module, wherein the second packaging module comprises a routing structure, a plurality of second conductive elements disposed on the routing structure and a second packaging layer formed on the routing structure to cover the plurality of second conductive elements, and wherein the routing structure is overlapped on the circuit structure, each of the second conductive elements is correspondingly and directly bonded with and electrically connected to each of the first conductive elements, and the second packaging module is disposed on the first packaging layer of the first packaging module via the second packaging layer.

7. The method of claim 6, wherein the first packaging layer has a coefficient of thermal expansion different from a coefficient of thermal expansion of the second packaging layer.

8. The method of claim 6, further comprising forming a bonding layer on the first packaging layer for the second packaging layer to be disposed on the first packaging layer via the bonding layer.

9. The method of claim 8, wherein the bonding layer covers joints between the plurality of first conductive elements and the plurality of second conductive elements.

10. The method of claim 6, wherein end portions of the plurality of first conductive elements and end portions of the plurality of second conductive elements are exposed from the first packaging layer and the second packaging layer, respectively.

* * * * *